(12) United States Patent
Singh et al.

(10) Patent No.: US 10,741,495 B2
(45) Date of Patent: Aug. 11, 2020

(54) STRUCTURE AND METHOD TO REDUCE SHORTS AND CONTACT RESISTANCE IN SEMICONDUCTOR DEVICES

(71) Applicant: GLOBALFOUNDRIES INC., Grand Cayman (KY)

(72) Inventors: Sunil K. Singh, Mechanicville, NY (US); Vinit O. Todi, Clifton Park, NY (US); Shao Beng Law, Watervliet, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/873,946

(22) Filed: Jan. 18, 2018

(65) Prior Publication Data

US 2019/0221523 A1 Jul. 18, 2019

(51) Int. Cl.
*H01L 23/522* (2006.01)
*H01L 23/532* (2006.01)
(Continued)

(52) U.S. Cl.
CPC .. *H01L 23/53295* (2013.01); *H01L 21/31058* (2013.01); *H01L 21/31138* (2013.01);
(Continued)

(58) Field of Classification Search
CPC . H01L 29/41–42396; H01L 23/49838–49844; H01L 21/28587–28593; H01L 23/535; H01L 21/76877–76883; H01L 21/76802–76817;
(Continued)

(56) References Cited

U.S. PATENT DOCUMENTS 5,866,945 A * 2/1999 Chen ............... H01L 21/314
257/750
5,981,377 A * 11/1999 Koyama ......... H01L 21/76807
257/E21.579

(Continued)

OTHER PUBLICATIONS

Tapan K. Gupta, "Copper Interconnect Technology," Chapter 2; Dielectric Materials, Springer Science+Business Media, LLC, 2009, pp. 67-110.

*Primary Examiner* — Jarrett J Stark
(74) *Attorney, Agent, or Firm* — Gibb & Riley, LLC; Anthony J. Canale (57) ABSTRACT

In an exemplary method, a first dielectric layer is formed on a substrate. A second dielectric layer is formed on the first dielectric layer. The second dielectric layer is a carbon rich film and different from the first dielectric layer. A trench is formed through the first and second dielectric layers. A conductive line is formed in the trench. A third dielectric layer is formed on the second dielectric layer and conductive line. The material of the third dielectric layer is different from the second dielectric layer. A via opening is formed through the third dielectric layer and stops at the second dielectric layer with a portion of the conductive line exposed to the via opening. At the bottom of the via opening, a recess is formed in the second dielectric layer adjacent to the conductive line. The via opening and recess are filled with a conductive material contacting the conductive line.

20 Claims, 10 Drawing Sheets

(51) Int. Cl.
*H01L 21/3105* (2006.01)
*H01L 21/311* (2006.01)
*H01L 21/768* (2006.01)

(52) U.S. Cl.
CPC .. *H01L 21/76808* (2013.01); *H01L 21/76811* (2013.01); *H01L 21/76813* (2013.01); *H01L 21/76814* (2013.01)

(58) Field of Classification Search
CPC .............. H01L 2221/1015–1036; H01L 21/76807–76813
See application file for complete search history.

(56) References Cited

U.S. PATENT DOCUMENTS

| | | | | |
|---|---|---|---|---|
| 6,136,729 | A * | 10/2000 | Hopper | H01L 21/02134 257/E21.262 |
| 6,291,334 | B1 | 9/2001 | Somekh | |
| 6,960,529 | B1 * | 11/2005 | Nelson | H01L 21/76852 438/622 |
| 6,972,217 | B1 * | 12/2005 | Allman | H01L 21/3105 257/E21.241 |
| 7,317,253 | B2 * | 1/2008 | Nogami | H01L 21/76808 257/758 |
| 7,626,245 | B2 | 12/2009 | Tsai et al. | |
| 7,942,945 | B1 | 5/2011 | Zantye et al. | |
| 9,355,893 | B1 | 5/2016 | Chen et al. | |
| 9,437,540 | B2 | 9/2016 | Lin et al. | |
| 9,853,131 | B1 * | 12/2017 | Cheng | H01L 21/823418 |
| 9,870,932 | B1 * | 1/2018 | Park | H01J 37/32357 |
| 2001/0013618 | A1 * | 8/2001 | Oashi | H01L 21/76832 257/306 |
| 2003/0211746 | A1 * | 11/2003 | Chen | H01L 21/76801 438/700 |
| 2005/0280152 | A1 * | 12/2005 | Fitzsimmons | H01L 21/76805 257/750 |
| 2006/0237853 | A1 * | 10/2006 | Nogami | H01L 21/76808 257/775 |
| 2006/0263701 | A1 * | 11/2006 | Lai | G03F 1/30 430/5 |
| 2007/0026667 | A1 * | 2/2007 | Tashiro | C08G 77/52 438/637 |
| 2007/0087272 | A1 * | 4/2007 | Lai | G03F 1/34 430/5 |
| 2007/0254218 | A1 * | 11/2007 | Lai | G03F 1/34 430/5 |
| 2008/0020293 | A1 * | 1/2008 | Lai | G03F 1/28 430/5 |
| 2010/0301491 | A1 * | 12/2010 | Yang | H01L 21/02063 257/774 |
| 2016/0079161 | A1 * | 3/2016 | Lin | H01L 23/5226 257/774 |
| 2018/0040734 | A1 * | 2/2018 | Chang | H01L 21/76877 |
| 2018/0247008 | A1 * | 8/2018 | Hamouda | G03F 1/36 |
| 2019/0013207 | A1 * | 1/2019 | Kobayashi | H01L 21/67069 |

* cited by examiner

STRUCTURE AND METHOD TO REDUCE SHORTS AND CONTACT RESISTANCE IN SEMICONDUCTOR DEVICES

BACKGROUND

The present disclosure relates to semiconductor device fabrication, and, more specifically, to methods of forming integrated circuit (IC) structures with self-aligned contacts to avoid shorts and reduce contact resistance.

Electronic devices, particularly integrated circuits, comprise a large number of components fabricated by layering several different materials onto a silicon wafer. In order for the components to function as an electronic device, they are selectively, electrically connected to one another. Metal lines are utilized to electrically connect components. The metal lines provide electrical connection within a layer, while vias connect different metallization and via layers. It is important that a good connection between the via and metal line exists in order to ensure that the proper amount of current is carried with minimal resistance between the connected components.

Integrated circuit (IC) structures have internal contacts that connect the semiconductor devices to various metal levels. For example, a field effect transistor (FET) can have a gate contact and source/drain contacts. The gate contact can extend vertically through interlayer dielectric (ILD) material from a metal wire or via in the first metal level to the gate of the FET. The source/drain contacts can extend vertically through ILD material from metal wires or vias in the metal level to metal plugs or other contacts, which are on the source/drain regions of the FET. Historically, in order to avoid shorts between the gate contact and the metal plugs, the gate contact is formed on a portion of the gate that is offset from the active region of the FET and, more particularly, on a portion of the gate that extends laterally over the adjacent isolation region. However, given the ever present need for size scaling of devices, it would be advantageous to provide a method that, not only allows for a gate contact to be formed on a portion of the gate directly above the active region or close thereto, but ensures that the risk of a short developing between the gate contact and any of the metal plugs is avoided (or at least significantly reduced).

Advancing technology continues to make smaller structures in integrated circuit (IC) devices. However, as IC components get smaller, the risk of small or misaligned vias gives rise to high contact resistance or open circuits. Micro-trenching in the circuit structure can lead to poor barrier coverage and voids, which also cause high via resistance and reliability concern. In design and fabrication of smaller and smaller IC components there is an ongoing struggle between performance and reliability. That is, reliability requires thick dielectric barriers while performance requires the thinnest barrier possible.

Fabrication of integrated circuits generally requires the formation of multiple integrated circuit patterns on one or more layers over a substrate wafer. These patterns generally include numerous regions of micro-structures or nano-structures that are formed through photolithography. Photolithography is a commonly used technique in the manufacture of semiconductor devices. The process uses patterns to define regions on a substrate. More specifically, with photolithography, a photoresist layer may be formed on a substrate, such as a silicon wafer, and then the resist layer is covered with a mask containing a pattern. The mask is exposed to radiation, such as ultraviolet light (UV), which is transmitted through transparent areas of the mask to cause a chemical reaction in corresponding regions of the photoresist. In other words, in the course of processing integrated circuits and the like in semiconductor devices, a standard sequence may involve putting down a layer of material, depositing a layer of photoresist on the layer of material, patterning the photoresist by projecting a pattern on it, and developing the resist to produce a pattern of open areas that expose the underlying material, with the other areas of the material still covered by the resist. Depending on whether a positive or negative tone resist is used, the exposed or unexposed portions of the photoresist layer are removed. The portions not protected by the photoresist are then etched to form the features in the substrate.

SUMMARY

According to devices and methods herein, two layers of interlayer dielectric (ILD) are deposited on each other. One layer may be an organic (Carbon) layer formed on a silicon layer. The organic layer replaces a traditional etch stop and enables controlled etching to form a side contact adjacent to an upper surface of a via, which can increase the contact area of the conductive materials thereby reducing electrical resistance.

According to an exemplary method herein, a first dielectric layer is formed on a substrate. A second dielectric layer is formed on the first dielectric layer. The second dielectric layer is a carbon rich film and different from the first dielectric layer. A trench is formed through the first dielectric layer and the second dielectric layer. A conductive line is formed in the trench. The conductive line is connected to operational devices of an integrated circuit. A third dielectric layer is formed on the second dielectric layer and the conductive line. The material of the third dielectric layer is different from the material of the second dielectric layer. A via opening is formed through the third dielectric layer. The via opening stops at the second dielectric layer with a portion of the conductive line exposed to the via opening. At the bottom of the via opening, a recess is formed in the second dielectric layer by using a cleaning process to remove a portion of the second dielectric layer adjacent to the conductive line. The via opening and the recess are filled with a conductive material contacting the conductive line.

According to other exemplary methods herein, a substrate having a top surface and a bottom surface is provided. A first dielectric layer is deposited on the top surface of the substrate. The first dielectric layer has a top surface and a bottom surface, and the bottom surface of the first dielectric layer contacts the top surface of the substrate. A second dielectric layer is deposited on the top surface of the first dielectric layer. The second dielectric layer has a top surface and a bottom surface. The bottom surface of the second dielectric layer contacts the top surface of the first dielectric layer. The second dielectric layer is an organic film and different from the first dielectric layer. A first etching process is performed, forming a trench through the first dielectric layer and the second dielectric layer. The trench is filled with a first conductive material to form a conductive line connected to operational devices of an integrated circuit. A third dielectric layer is deposited on the top surface of the second dielectric layer over the first conductive material in the trench. The third dielectric layer has a top surface and a bottom surface. The bottom surface of the third dielectric layer contacts the top surface of the second dielectric layer. The material of the third dielectric layer is different from the material of the second dielectric layer. A second etching process is performed, forming a via opening through the third dielectric layer. The second etching process stops on the top surface of the second dielectric layer. The via opening has a top and a bottom. The top is coplanar with the top surface of the third dielectric layer and the bottom is coplanar with the top surface of the second dielectric layer. A portion of the first conductive material in the trench is exposed to the via opening. At the bottom of the via opening, a recess is formed in the second dielectric layer by using a cleaning process to remove a portion of the second dielectric layer adjacent to the first conductive material in the trench. The via opening and the recess are filled with a second conductive material.

According to additional exemplary methods herein, a stacked structure is formed in an area of a substrate. The substrate is the kind usable for fabricating semiconductor devices. The stacked structure includes a first layer of dielectric material having a top surface and a bottom surface and a second layer of dielectric material on the top surface of the first layer of dielectric material. The second layer of dielectric material has a top surface and a bottom surface. The bottom surface of the second layer of dielectric material contacts the top surface of the first layer of dielectric material. The dielectric material in the second layer of dielectric material is a carbon rich organic film. A conductive line is formed in the stacked structure, with a first top surface of the conductive line being substantially coplanar with a second top surface of the stacked structure. The conductive line is connected to semiconductor devices of an integrated circuit. A third layer of dielectric material is formed over the conductive line and the stacked structure. The third layer of dielectric material has a top surface and a bottom surface. The bottom surface of the third layer of dielectric material contacts the first top surface of the conductive line and the second top surface of the stacked structure. A first etching process is performed to etch the third layer of dielectric material to form a via opening through the third layer of dielectric material. The first etching process stops on the first top surface of the conductive line and the second top surface of the stacked structure. The via opening has a top and a bottom, the top being coplanar with the top surface of the third layer of dielectric material and the bottom being coplanar with the second top surface of the stacked structure. A portion of the conductive line is exposed to the via opening. At the bottom of the via opening, a second etching process is performed to etch a portion of the second layer of dielectric material in the stacked structure in order to form a recess in the second layer of dielectric material adjacent to the conductive line. The via opening and the recess are filled with a conductive material to form a via electrically coupled to the conductive line.

An exemplary structure herein includes a substrate having a top surface and a bottom surface. A first dielectric layer is on the top surface of the substrate. The first dielectric layer has a top surface and a bottom surface, and the bottom surface of the first dielectric layer contacts the top surface of the substrate. A second dielectric layer is on the top surface of the first dielectric layer. The second dielectric layer has a top surface and a bottom surface, and the bottom surface of the second dielectric layer contacts the top surface of the first dielectric layer. The second dielectric layer is an organic film and is different from the first dielectric layer. A conductive line is located in a trench formed through the first dielectric layer and the second dielectric layer. A third dielectric layer is on the second dielectric layer. The third dielectric layer has a top surface and a bottom surface, and the bottom surface of the third dielectric layer contacts the top surface of the second dielectric layer. The material of the third dielectric layer is different from the material of the second dielectric layer. A conductive via is located in a via opening formed through the third dielectric layer and a portion of the second dielectric layer adjacent to the conductive line. The conductive via contacts a top surface of the conductive line and a portion of a side of the conductive line.

BRIEF DESCRIPTION OF THE DRAWINGS

The devices and methods herein will be better understood from the following detailed description with reference to the drawings, which are not necessarily drawn to scale and in which.

DETAILED DESCRIPTION

The disclosure will now be described with reference to a process to reduce shorts and contact resistance in semiconductor devices during processing of a semiconductor wafer. While the disclosure will be described hereinafter in connection with specific devices and methods thereof, it will be understood that limiting the disclosure to such specific devices and methods is not intended. On the contrary, it is intended to cover all alternatives, modifications, and equivalents as may be included within the spirit and scope of the disclosure as defined by the appended claims.

For a general understanding of the features of the disclosure, reference is made to the drawings. The drawings are not to scale; however, in the drawings, like reference numerals have been used throughout to identify identical elements.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims, but is merely representative of selected devices and methods. The following description is intended only by way of example, and simply illustrates certain concepts of the devices and methods, as disclosed and claimed herein.

The fabrication of integrated circuits (ICs) typically involves the formation of features on a substrate that make up circuit components, such as transistors, resistors and capacitors, and the interconnection of such components. To form the features, layers are repeatedly deposited on the substrate and patterned as desired. A plurality of ICs may be formed on a semiconductor substrate, such as a silicon wafer, in parallel.

During fabrication, a substrate or wafer may be processed through numerous procedures to create semiconductor devices. One such procedure may be thermal processing of the substrate. The substrate experiences thermal processing in order to activate dopant atoms implanted in regions of the substrate, for example, source and drain regions, with minimal dopant diffusion. The dopants may be used to designate the conductive characteristics of the wafer to either an n-type or p-type silicon.

Another such procedure is lithography, for example, photolithography. The substrate is processed using photolithography to transfer patterns or images for the circuit elements of the device onto the wafer using one or more masks.

Semiconductor device fabrication is typically a multiple step sequence of photolithographic and chemical processing steps during which electronic circuits are gradually created on a wafer made of semiconducting material. Etching may be used to remove layers from the surface of a wafer and to form trenches in the wafer during manufacturing. Etching, in conjunction with lithographic techniques, may be used to attack certain areas of a semiconductor surface in order to form recesses in the material or to otherwise remove portions of semiconductor layers. For many etching steps, part of the wafer is protected from the etchant by a masking material that resists etching.

For electronic applications, semiconducting substrates, such as silicon wafers, can be used. The substrate enables easy handling of the micro device through the many fabrication steps. Often many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithographic steps, oxidation steps, etching steps, doping steps, and many other steps performed. The complexity of microfabrication processes can be described by their mask count.

Optical lithography typically uses light against a photoresist. A photoresist is a light-sensitive material used to selectively expose a layer of material on a substrate. There are two types of photoresists. Positive photoresist, the most common type, becomes soluble in the basic developer when exposed; negative photoresist becomes insoluble in the developer. This chemical change allows some of the photoresist to be removed by a special solution, called "developer" by analogy with photographic developer. In other words, a positive resist is a type of photoresist in which the portion of the photoresist that is exposed to light becomes soluble to the photoresist developer. The portion of the photoresist that is unexposed remains insoluble to the photoresist developer. A negative resist is a type of photoresist in which the portion of the photoresist that is exposed to light becomes insoluble to the photoresist developer. The photoresist developer dissolves the unexposed portion of the photoresist.

During a process flow for fabricating an IC, numerous lithographic steps are, typically, required. Advancing technology continues to make smaller structures in the IC devices. However, as IC components get smaller, the risk of small or misaligned vias gives rise to high contact resistance or open circuits. Micro-trenching in the circuit structure can lead to poor barrier coverage and voids, which also cause high resistance in the vias and reliability concerns. In design and fabrication of smaller and smaller IC components there is an ongoing struggle between performance and reliability.

Advantageously, the methods disclosed herein may improve the functioning of the electrical circuits by improving the electrical contact between the various structures and may reduce the number of wafers that are discarded due to shorts or open circuits. In addition, the methods disclosed herein may remove the need for rework, which may, for example, reduce device costs, shorten cycle time, and improve device yield.

Figure 1:
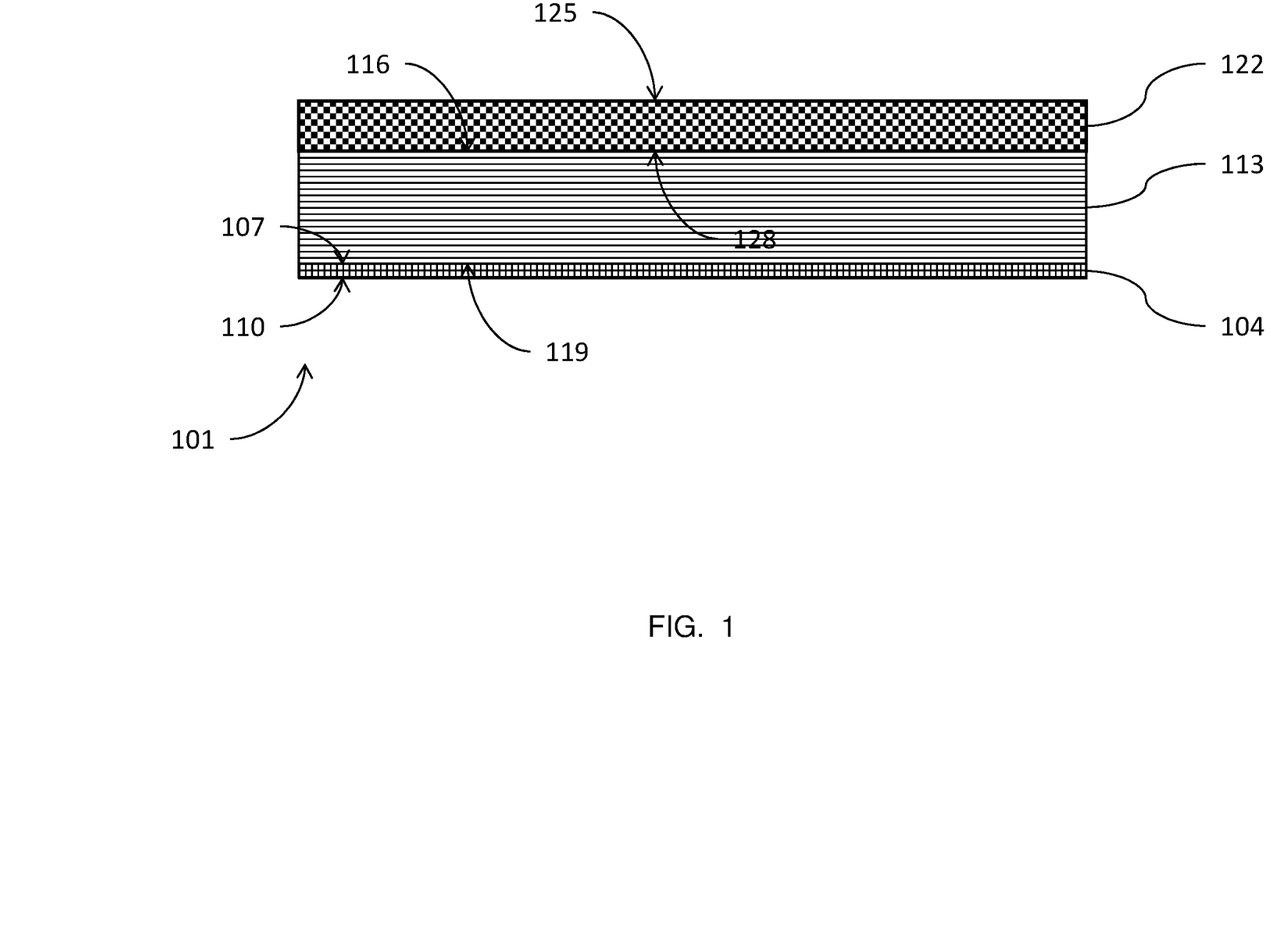
FIGS. 1-8 are cross-section views of a multi-layer structure illustrating the processing steps for producing an electrical connection in an integrated circuit according to devices and methods herein.

Now, referring to the drawings, FIG. 1 shows an exemplary multi-layer stack, indicated generally as 101. The multi-layer stack 101 may include a substrate 104. The substrate 104 may be any conventional semiconductor substrate such as, for example, a bulk silicon substrate or an active layer of semiconductor material of a silicon-on-insulator (SOI). The substrate 104 has a top surface 107 and a bottom surface 110. The multi-layer stack 101 may further include two interlayer dielectric (ILD) layers. The first ILD layer 113 has a top surface 116 and a bottom surface 119. The bottom surface 119 of the first ILD layer 113 is in contact with the top surface 107 of the substrate 104. The first ILD layer 113 can be, for example, silicon oxide, a nitride, or any other suitable interlayer dielectric (ILD) material (e.g., borophosphosilicate glass (BPSG), tetraethyl orthosilicate (TEOS), fluorinated tetraethyl orthosilicate (FTEOS), etc.). The second ILD layer 122 has a top surface 125 and a bottom surface 128 and is formed on top of the first ILD layer 113. The bottom surface 128 of the second ILD layer 122 is in contact with the top surface 116 of the first ILD layer 113. The second ILD layer 122 can be an organic material, for example, a carbon rich film (e.g., poly(arylene ether) (PAE), Polyamides or fluorinated Polyamides, Parylene-N or Parylene-F, B-stage polymers, Diamond-like Carbon (DLC) or fluorinated-DLC, fluorinated amorphous Carbon, Polytetrafluoroethylene (PTFE) also known as Teflon®, etc.). The material of the second ILD layer 122 is a different material from the first ILD layer 113 and may be selected for its dielectric value (i.e., k constant), thermal stability, moisture absorption, adhesion qualities with metals and other dielectrics, and compatibility with lithographic chemicals. Further, the ILD layers 113, 122 may be formed using an appropriate layer deposition technique, such as atomic layer deposition (ALD), chemical vapor deposition (CVD), physical vapor deposition (PVD), spin-on deposition (SOD), or any other technique known in the art.

Figure 2:
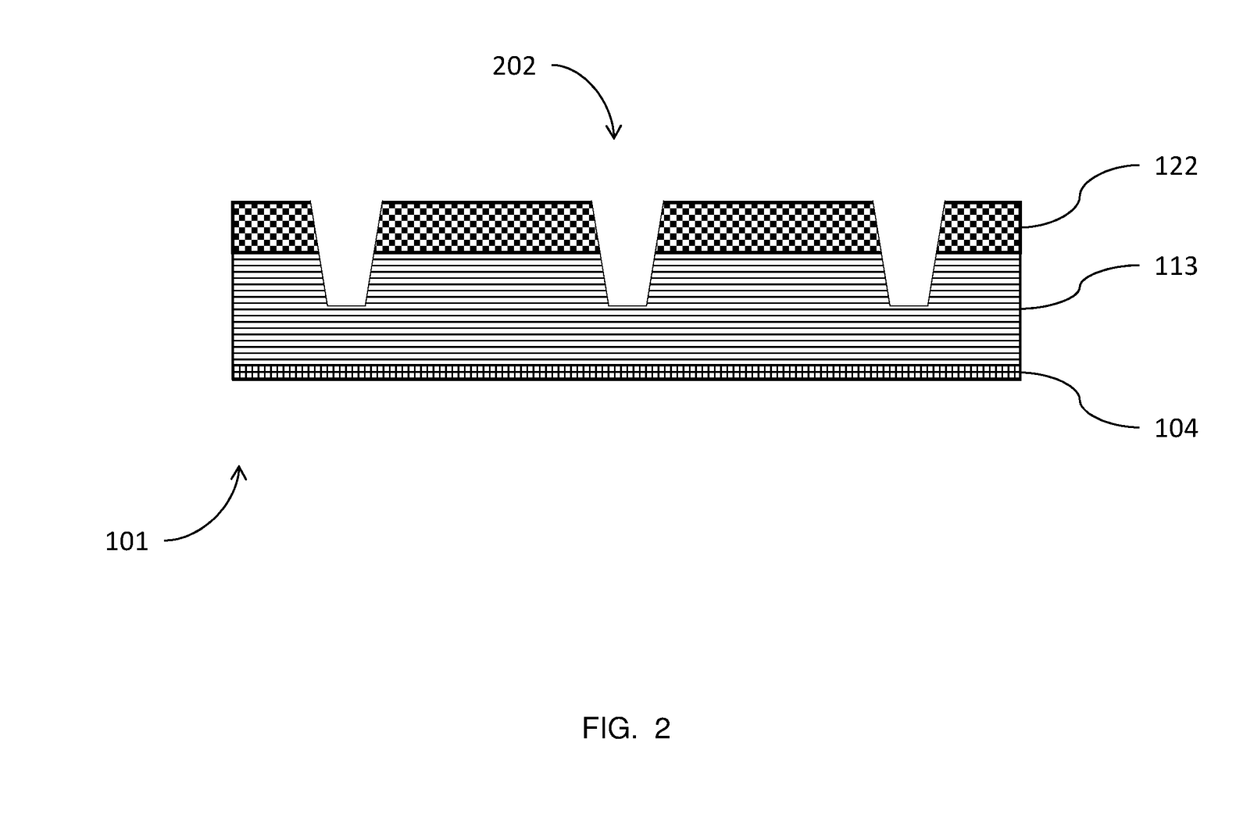

In FIG. 2, one or more trenches 202 may be formed through the first ILD layer 113 and the second ILD layer 122. When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process can then be performed (e.g., plasma etching, etc.) to remove the unprotected portions of the material to be patterned. The resist is subsequently removed to leave the underlying material patterned according to the light exposure pattern.

Figure 3:
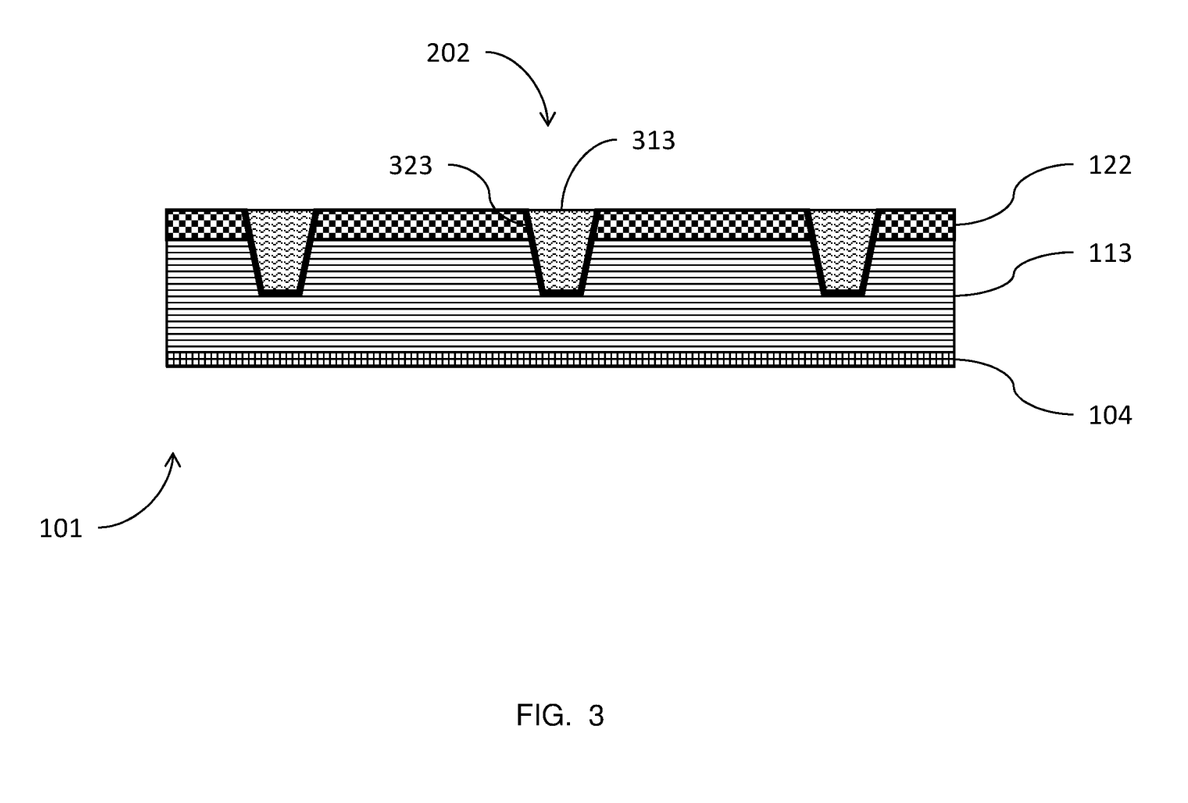

In FIG. 3, a conductive line 313 may be formed in a trench 202. The conductive line 313 can be, for example, tungsten (W), cobalt (Co), or ruthenium (Ru), although other metals, such as copper (Cu), aluminum (Al), or Titanium (Ti), can be used. It is also contemplated that alloys and nitrides, such as titanium nitride (TiN), of such metals can be used. As would be known to one of ordinary skill in the art, the conductive line 313 may include a barrier 323 made of appropriate barrier material. The conductive line 313 may be formed by etching openings in the interlayer dielectric material of ILD layers 113, 122 to form the trench 202, lining the trench 202 with a barrier 323 that incorporates one or more barrier layers of barrier material (e.g., titanium and/or titanium nitride), filling the trench 202 with a metal (e.g., tungsten (W), cobalt (Co), or ruthenium (Ru)) and performing a chemical-mechanical polishing (CMP) process to remove all material from above the top surface 125 of the second ILD layer 122.

Figure 4:
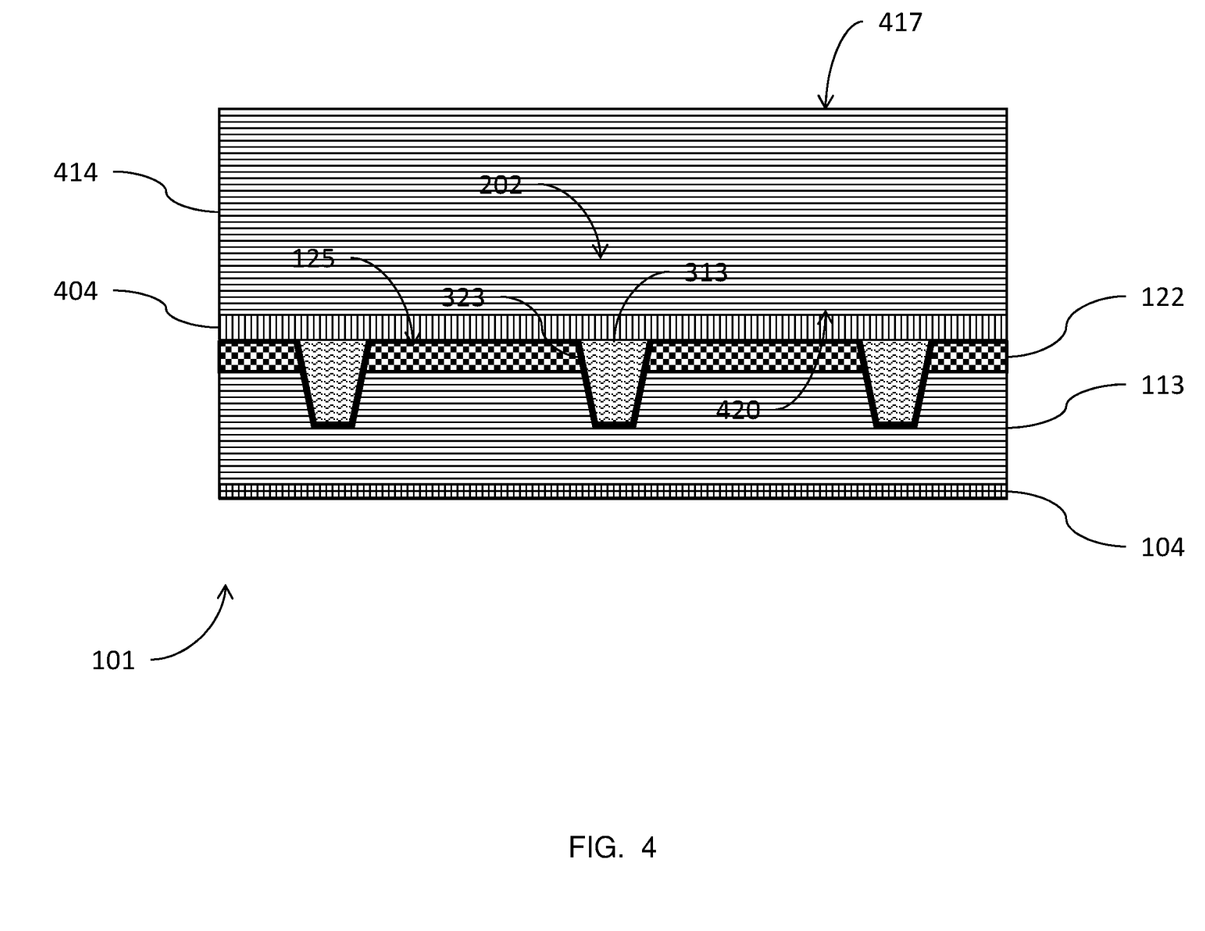

In FIG. 4, an etch-stop layer 404 can be formed or deposited over the conductive line 313 and the second ILD layer 122. A third ILD layer 414 can be formed or deposited over the etch-stop layer 404. The third ILD layer 414 has a top surface 417 and a bottom surface 420 and is formed on top of the etch-stop layer 404 or the second ILD layer 122. The bottom surface 420 of the third ILD layer 414 may be in contact with the top surface 125 of the second ILD layer 122. The third ILD layer 414 should be a material containing silicon (Si) having a dielectric constant between 2.0-3.0. Some examples of materials for the third ILD layer 414 include so-called ultra low-k dielectrics (ULK), extremely low-k dielectrics (ELK), DULK, Black Diamond® (Si-COH), octamethylcyclotetrasiloxane (OMCTS), etc. In some cases, the third ILD layer 414 can be the same material as the first ILD layer 113.

Figure 5:
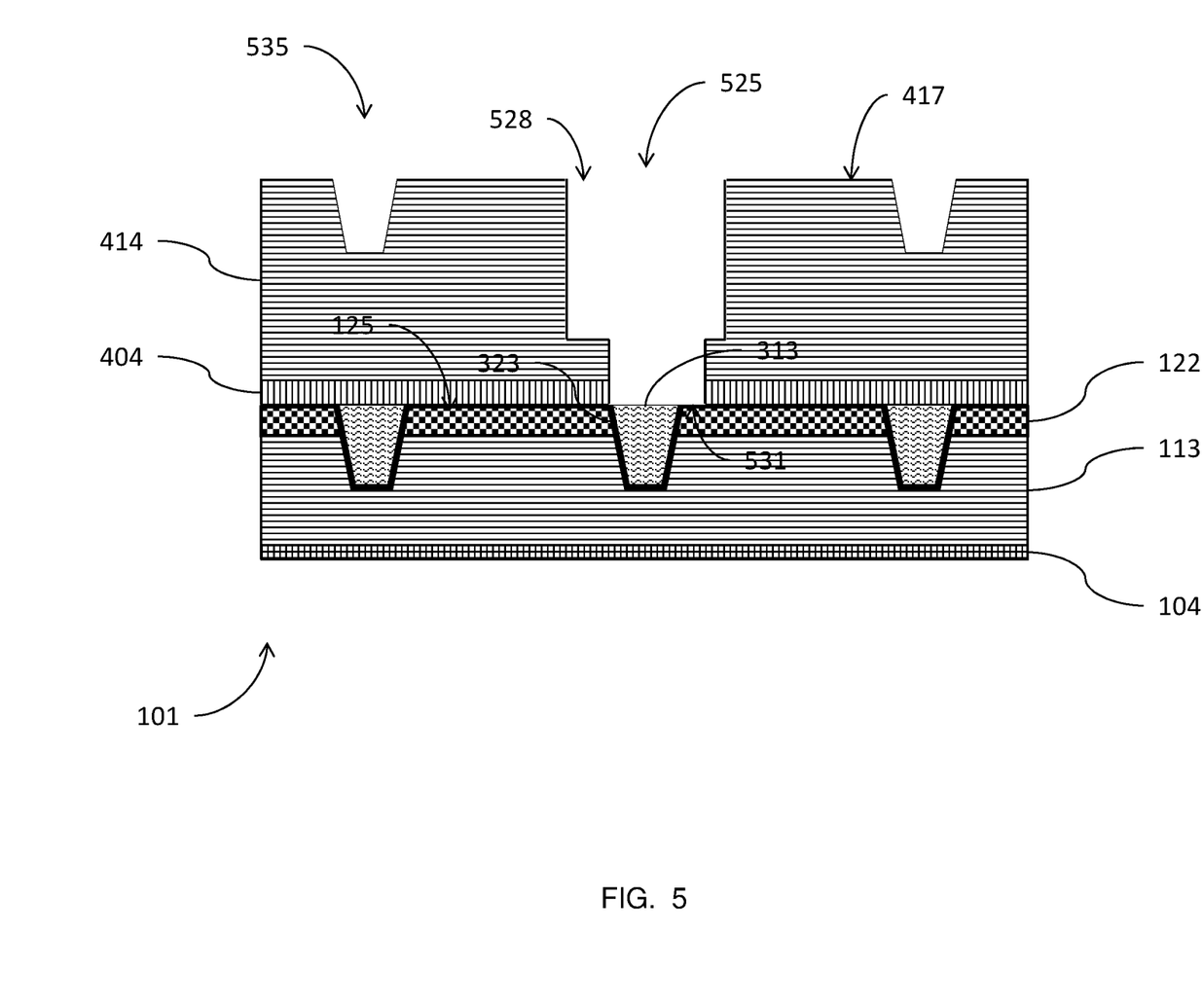

In FIG. 5, a via opening 525 may be formed through the third ILD layer 414. The via opening 525 may be formed by creating a trench, such as 535, in the third ILD layer 414 using an appropriate material removal process and etching the material underlying the trench 535 to form the via opening 525. The via opening 525 has a top 528 and a bottom 531. The top 528 of the via opening 525 is coplanar with the top surface 417 of the third ILD layer 414 and the bottom 531 of the via opening 525 is coplanar with the top surface 125 of the second ILD layer 122. The via opening 525 goes through the third ILD layer 414 such that at least a portion of the conductive line 313 is exposed in the via opening 525. The etching may comprise reactive ion etch (RIE), although other material removal processes can be used (e.g., plasma etching, etc.).

In a specific example, a lithographic process can be used to etch the third ILD layer 414 in order to form an initial via opening that extends from the top surface of the third ILD layer 414 to an intermediate level between the top surface and the bottom surface of the third ILD layer 414. Next, a hard mask (not shown) is formed and patterned to define the patterns of trenches 535. An anisotropic etching is then performed to etch the third ILD layer 414 to form trenches 535. At the same time, the via opening 525 extends down to etch-stop layer 404, hence forming the via opening 525, as illustrated. The etching step for forming trenches 535 may be performed using a time-mode, and may be stopped after the etching has been performed for a pre-set period of time. Other etch and stop point detection techniques are also contemplated. In alternative embodiments, the via opening 525 and trenches 535 may be formed in separate lithographic processes. For example, in a first lithographic process, the via opening 525 is formed to extend all the way down to etch-stop layer 404. In a second lithographic process, trenches 535 are formed to extend to an intermediate level of the third ILD layer 414. The etch-stop layer 404 is then etched to expose the underlying metal top of the conductive line 313.

Figure 6:
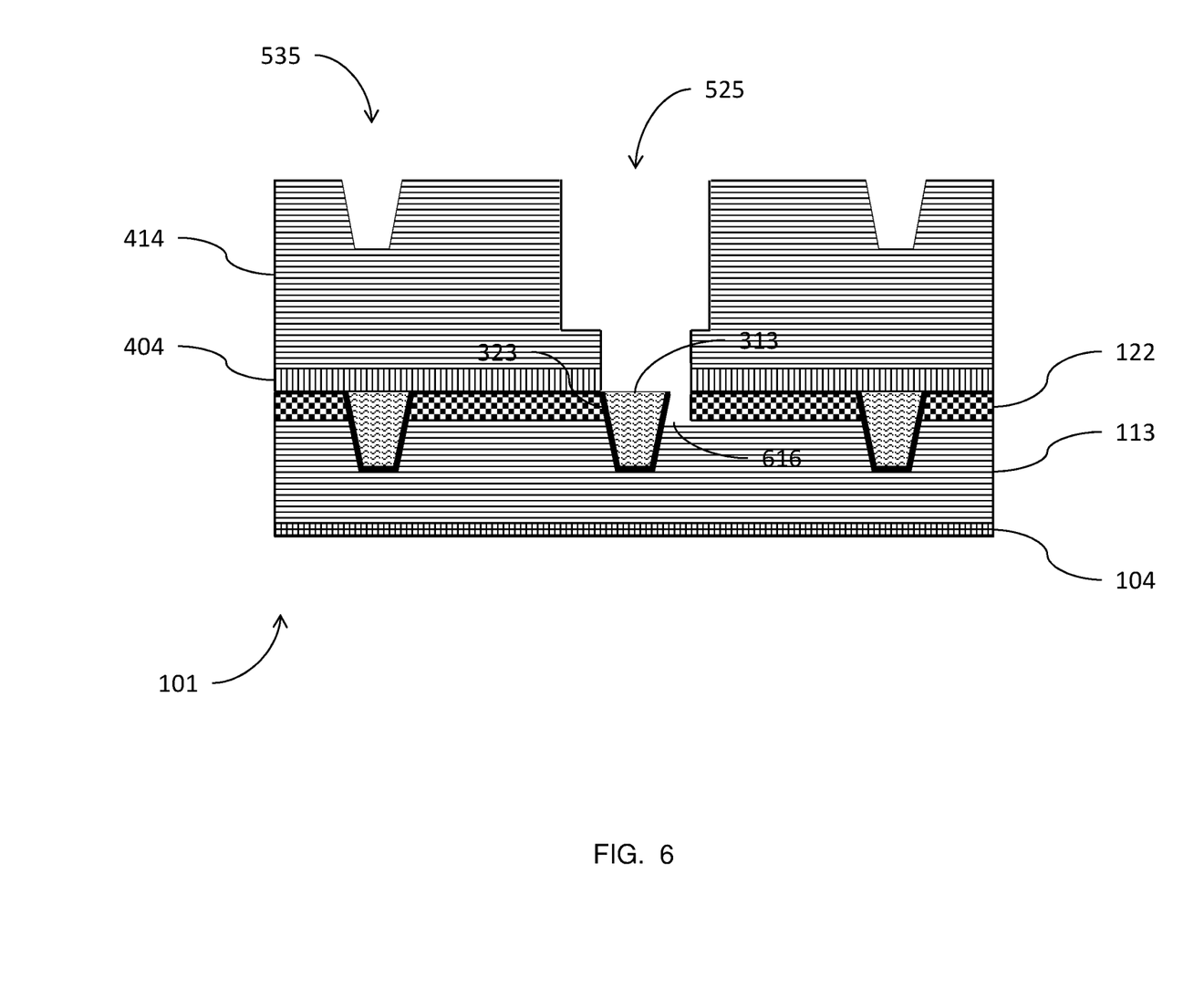

While some overlay misalignment may occur accidentally during the formation of the via opening 525, according to devices and methods herein, the via opening 525 may be intentionally shifted or widened to the right or left from the center of the corresponding underlying conductive line 313. As shown in FIG. 6, a recess 616 is formed in the second ILD layer 122 at the bottom 531 of the via opening 525. The second ILD layer 122 being a carbon rich organic film, it is desirable to use a wet etch that can remove a portion of the second ILD layer 122 in the area adjacent to the conductive line 313, as shown in FIG. 6. The wet etching may be accomplished by anisotropic etchants, including any of ethylenediamine pyrocatechol (EDP), potassium hydroxide/isopropyl alcohol (KOH/IPA), tetramethylammonium hydroxide (TMAH), and ammonia hydroxide (NH4OH).

Figure 7:
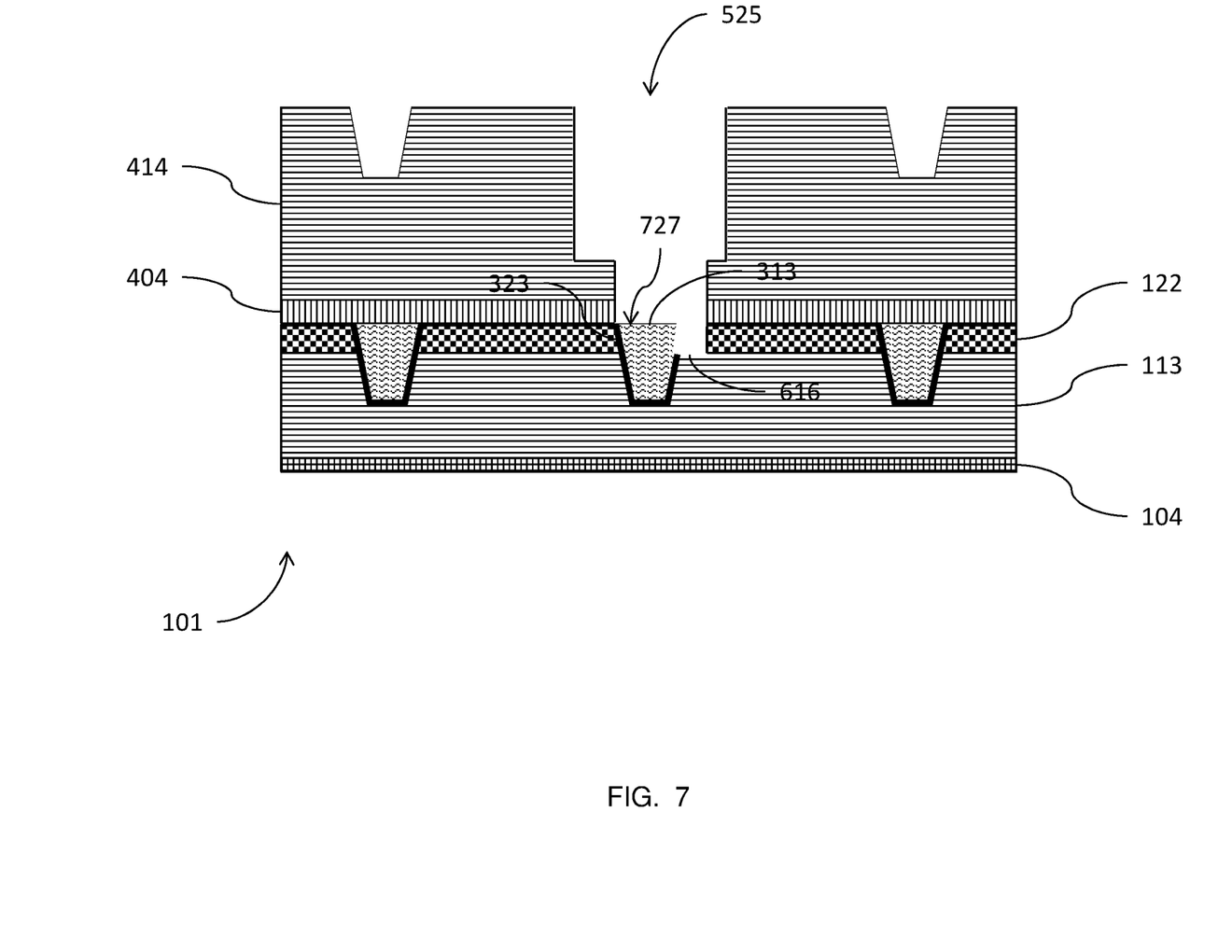
Figure 8:
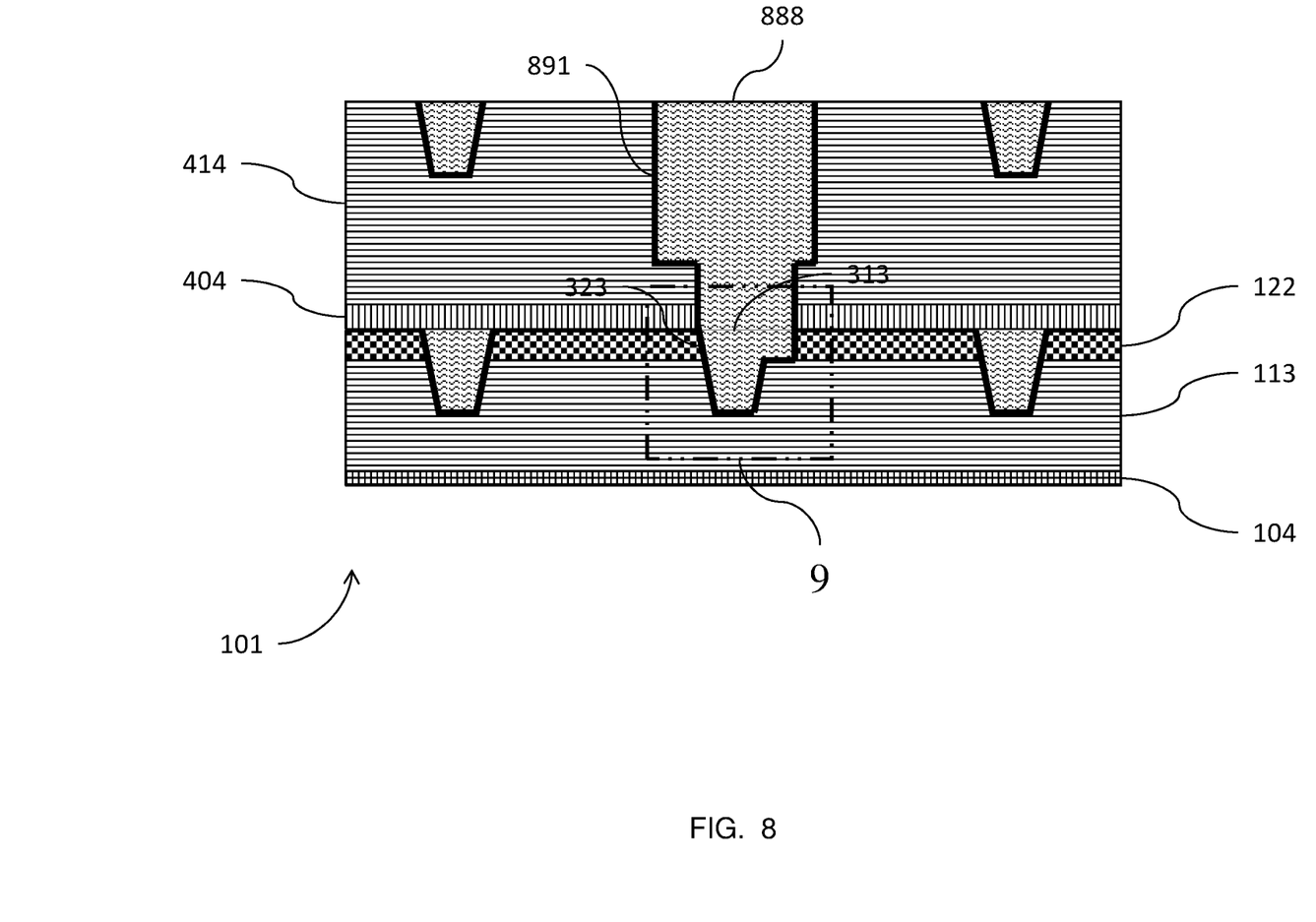

In FIG. 7, an appropriate cleaning process can be used to remove a portion of the barrier 323 that is adjacent to the recess 616. Then, as shown in FIG. 8, a conductive via 888 may be formed in the via opening 525. The conductive via 888 can be, for example, copper (Cu). Other materials can be used for the conductive via 888, such as aluminum (Al), tungsten (W), cobalt (Co), etc., and alloys or nitrides of such metals, such as titanium nitride (TiN). As would be known to one of ordinary skill in the art, the conductive via 888 may include a barrier 891 made of appropriate barrier material. The conductive via 888 may be formed by etching the via opening 525 in the interlayer dielectric material of the third ILD layer 414. The etching stops on the top surface 125 of the second ILD layer 122 and the top surface 727 of the conductive line 313. The top surface 727 of the conductive line 313 is substantially parallel to the top surface 125 of the second ILD layer 122. The recess 616 is then formed in the second ILD layer 122. The recess 616 may penetrate to the top surface 116 of the first ILD layer 113. One vertical side of the recess may be in the same vertical plane as a sidewall of the via opening, which is substantially perpendicular to the top surface 727 of the conductive line 313 and the top surface 125 of the second ILD layer 122. The opposite vertical side of the recess 616 conforms to the shape of the conductive line 313, and can be non-parallel to the first vertical side. Therefore, the side of the recess 616 formed by the barrier 323 conforming to the conductive line 313 can be non-perpendicular to, and non-parallel to, (e.g., at an obtuse or acute angle to) the top surface 727 of the conductive line 313. This causes, in this example, the "bottom" of the recess 616 (located at the top surface of the first ILD layer 113) to be wider than the opposing "top" of the recess (located at the top surface 727 of the conductive line 313). The via opening 525 and external walls of the recess 616 may be lined with a barrier 891 that can incorporate one or more barrier layers (e.g., of titanium and/or titanium nitride). The via opening 525 and the recess 616 are filled with a metal (e.g., copper).

Figure 9:
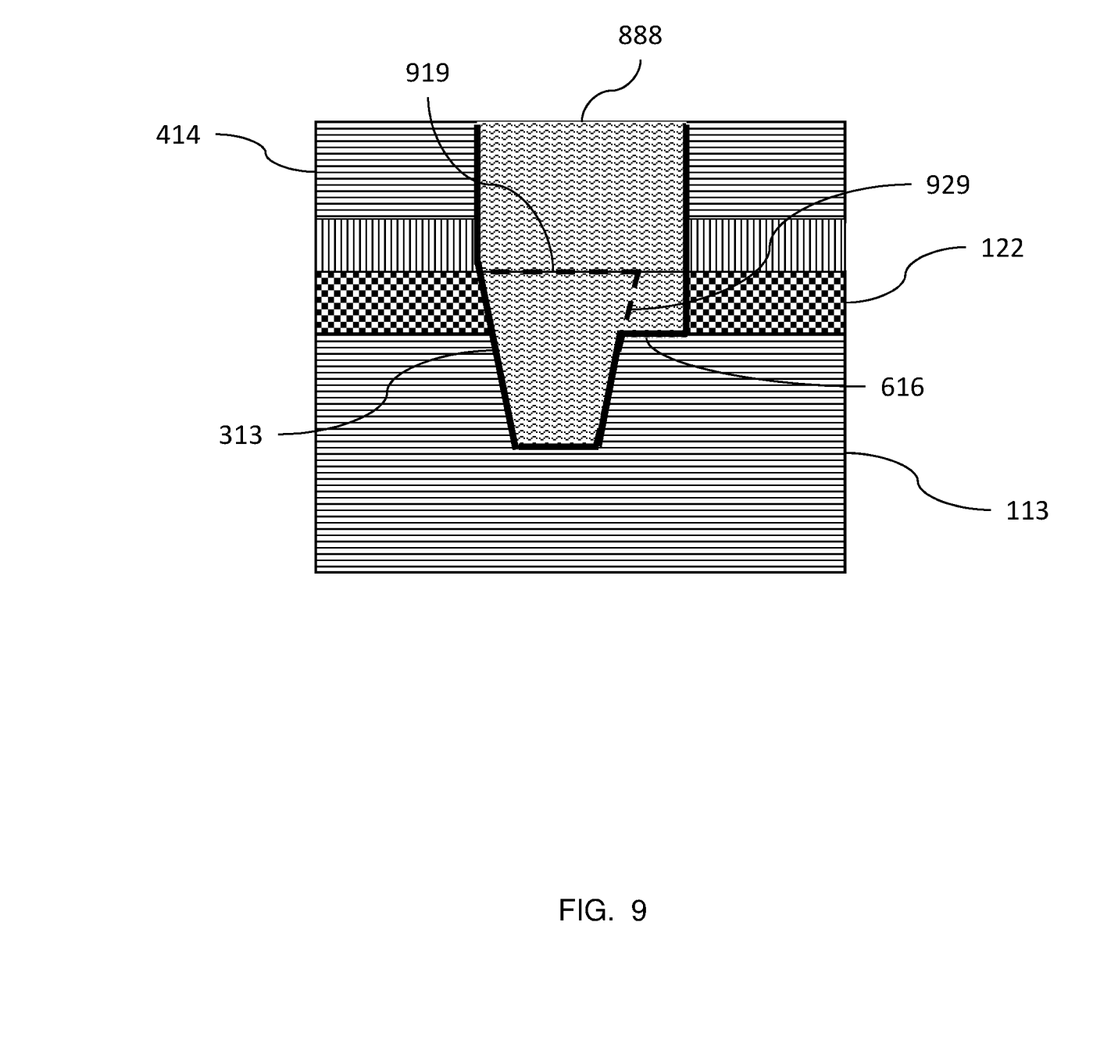
FIG. 9 is a close-up of a section of the multi-layer structure of FIG. 8, indicated by the broken line box, illustrating the increased contact area according to devices and methods herein.

FIG. 9 is a close-up of a section of the multi-layer structure of FIG. 8, indicated by the broken line box, indicated as 9. As shown in FIG. 9, the recess 616, when filled with metal, provides additional contact area between the conductive line 313 and the conductive via 888. In FIG. 9, the conductive via 888 contacts the top surface 727 of the conductive line 313, as indicated by broken line 919. Further, the metal fill in the recess 616, which is an extension of the conductive via 888, contacts a side portion of the conductive line 313, as indicated by broken line 929. This can increase the contact area by up to 50%, which reduces electrical resistance in the conductive via 888.

As described herein, the process is particularly useful in back end of line (BEOL) processing in order to electrically couple integrated circuit components in a semiconductor structure; however, this method can be applied to any electrical connection between conductive lines/wires and vias between metallization levels of the semiconductor structure.

Figure 10:
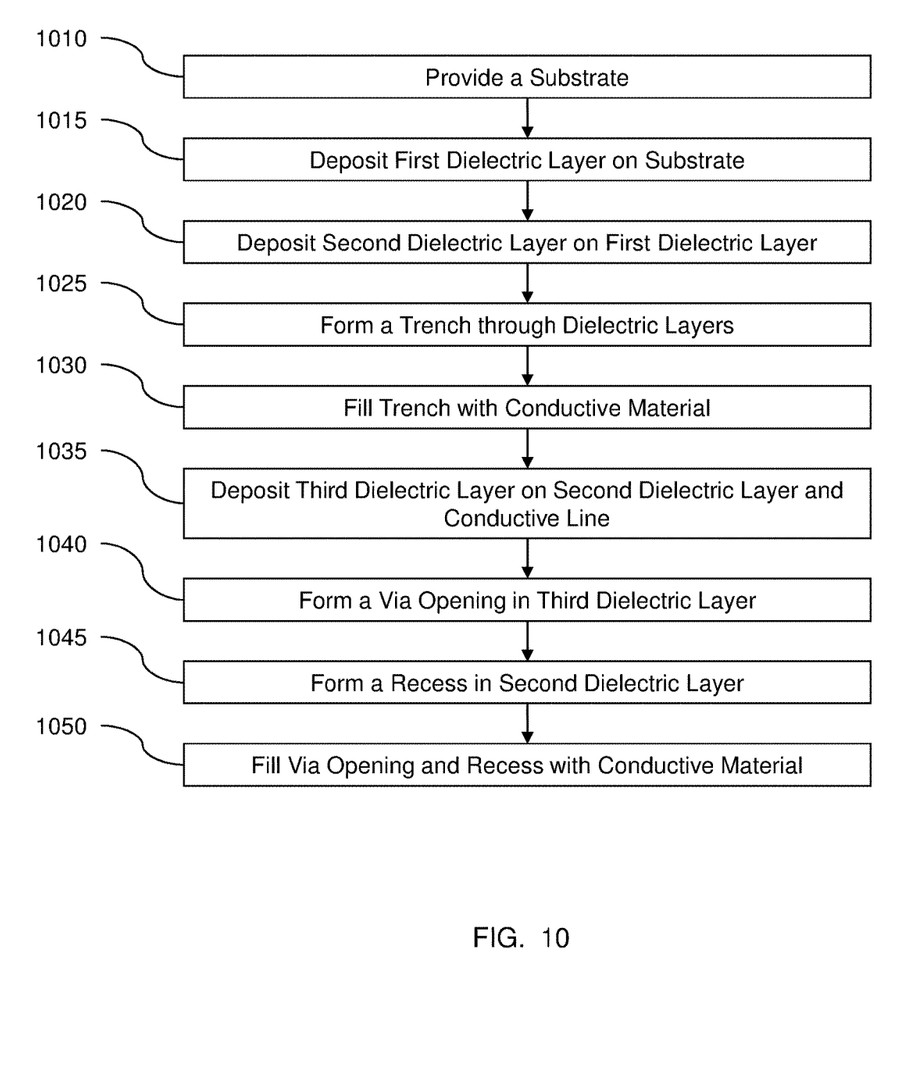
FIG. 10 is a flow diagram illustrating methods herein.

FIG. 10 is a flow diagram illustrating the processing flow of an exemplary method to reduce shorts and contact resistance in semiconductor devices, such as described above. At 1010, a substrate is provided (e.g., a bulk silicon substrate or any other suitable semiconductor substrate). The substrate has a top surface and a bottom surface. A first layer of dielectric material is deposited on the top surface of the substrate, at 1015. The first layer of dielectric material has a top surface and a bottom surface, and the bottom surface of the first layer of dielectric material contacts the top surface of the substrate. At 1020, a second layer of dielectric material is deposited on the top surface of the first layer of dielectric material. The second layer of dielectric material has a top surface and a bottom surface. The bottom surface of the second layer of dielectric material contacts the top surface of the first layer of dielectric material. The second layer of dielectric material is an organic film and is different from the first layer of dielectric material. The organic film can be a carbon rich film. At 1025, a first etching process is performed, forming a trench through the first layer of dielectric material and the second layer of dielectric material. At 1030, the trench is filled with a first conductive material to form a conductive line connected to operational devices of an integrated circuit. At 1035, a third layer of dielectric material is deposited on the top surface of the second layer of dielectric material and over the first conductive material in the trench. The third layer of dielectric material has a top surface and a bottom surface. The bottom surface of the third layer of dielectric material contacts the top surface of the second layer of dielectric material. The material of the third layer of dielectric material is different from the material of the second layer of dielectric material. A second etching process is performed, at 1040, forming a via opening through the third layer of dielectric material. The second etching process stops on the top surface of the second layer of dielectric material. The via opening has a top and a bottom. The top is coplanar with the top surface of the third dielectric layer and the bottom is coplanar with the top surface of the second dielectric layer. A portion of the first conductive material in the trench is exposed to the via opening. At 1045, a recess is formed in the second dielectric layer at the bottom of the via opening by using a cleaning process to remove a portion of the second dielectric layer adjacent to the first conductive material in the trench. At 1050, the via opening and the recess are filled with a conductive material to form a via electrically coupled to the conductive line.

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises", "comprising", "includes", and "including", when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

While various examples are described herein, it will be appreciated from the specification that various combinations of elements, variations, or improvements therein may be made by those skilled in the art, and are within the scope of the disclosure. In addition, many modifications may be made to adapt a particular situation or material to the teachings of the disclosed concepts without departing from the essential scope thereof. Therefore, it is intended that the concepts not be limited to the particular examples disclosed as the best mode contemplated for carrying out the devices and methods herein, but that the devices and methods will include all features falling within the scope of the appended claims.

What is claimed is:

1. A method of connecting a via to a conductive line, the method comprising:
    forming a first dielectric layer on a substrate;
    forming a second dielectric layer on the first dielectric layer, the second dielectric layer being a carbon rich film and comprising a material different from the material of the first dielectric layer;
forming a trench through the first dielectric layer and the second dielectric layer;
forming a conductive line in the trench, the conductive line being connected to operational devices of an integrated circuit, wherein a top of the conductive line is coplanar with a top of the second dielectric layer;
forming a third dielectric layer on the second dielectric layer and the conductive line, the material of the third dielectric layer being different from the material of the second dielectric layer;
forming a via opening through the third dielectric layer, the via opening having a top and a bottom, wherein the bottom of the via opening stops at the top of the second dielectric layer with a portion of the top of the conductive line being exposed to the via opening;
performing an additional process at the bottom of the via opening to widen the width of the via opening, wherein widening the width of the via opening exposes a portion of the second dielectric layer adjacent to the conductive line;
forming a recess in the exposed portion of the second dielectric layer by using a wet etching process to remove the exposed portion of the second dielectric layer adjacent to the conductive line, wherein the wet etching process exposes a portion of a side of the conductive line; and
filling the via opening and the recess with a conductive material contacting the conductive line, wherein the conductive material contacts the exposed portion of the top of the conductive line and the exposed portion of the side of the conductive line.

2. The method according to claim 1, wherein forming the conductive line in the trench further comprises:
lining the trench with a barrier material;
filling the trench with a conductive material; and
performing a cleaning process to remove material from above the top of the second dielectric layer.

3. The method according to claim 2, wherein forming the recess in the second dielectric layer further comprises:
removing a portion of the barrier material that is adjacent to the recess.

4. The method according to claim 1, wherein forming the via opening through the third dielectric layer further comprises:
etching a second trench into the third dielectric layer; and
etching the via opening underlying the second trench through the third dielectric layer.

5. The method according to claim 4, further comprising:
lining the via opening with a barrier material; and
filling the via opening with a conductive material.

6. The method according to claim 1, wherein the material of the conductive line is different from the conductive material in the via opening.

7. The method according to claim 1, wherein the material of the third dielectric layer is different from the material of the first dielectric layer.

8. A method of manufacturing a structure, the method comprising:
providing a substrate having a top surface and a bottom surface;
depositing a first dielectric layer on the top surface of the substrate, the first dielectric layer having a top surface and a bottom surface, the bottom surface of the first dielectric layer contacting the top surface of the substrate;
depositing a second dielectric layer on the top surface of the first dielectric layer, the second dielectric layer having a top surface and a bottom surface, the bottom surface of the second dielectric layer contacting the top surface of the first dielectric layer, the second dielectric layer being an organic film and comprising a material different from the material of the first dielectric layer;
performing a first etching process and forming a trench through the first dielectric layer and the second dielectric layer;
filling the trench with a first conductive material, wherein the first conductive material forms a conductive line connected to operational devices of an integrated circuit, a top of the first conductive material being coplanar with the top surface of the second dielectric layer;
depositing a third dielectric layer on the top surface of the second dielectric layer, the third dielectric layer covering the first conductive material in the trench, the third dielectric layer having a top surface and a bottom surface, the bottom surface of the third dielectric layer contacting the top surface of the second dielectric layer, the material of the third dielectric layer being different from the material of the second dielectric layer;
performing a second etching process and forming a via opening through the third dielectric layer, the second etching process stopping at the top surface of the second dielectric layer, wherein the via opening has a top and a bottom, the top of the via opening being coplanar with the top surface of the third dielectric layer and the bottom of the via opening being coplanar with the top surface of the second dielectric layer, a portion of the top of the first conductive material in the trench being exposed to the via opening by the second etching process;
performing an additional process to widen the width of the via opening at the bottom of the via opening, wherein a portion of the top surface of the second dielectric layer is exposed adjacent to the exposed portion of the top of the first conductive material;
forming a recess in the exposed portion of the second dielectric layer by using a wet etching process to remove the exposed portion of the second dielectric layer adjacent to the first conductive material, wherein the wet etching process exposes a portion of a side of the first conductive material; and
filling the via opening and the recess with a second conductive material, wherein the second conductive material contacts the exposed portion of the top of the first conductive material and the exposed portion of the side of the first conductive material.

9. The method according to claim 8, wherein forming the conductive line further comprises:
lining the trench with a barrier material;
filling the trench with a conductive material; and
performing a cleaning process to remove material from above the top surface of the second dielectric layer.

10. The method according to claim 9, wherein forming the recess in the second dielectric layer further comprises:
removing a portion of the barrier material that is adjacent to the recess.

11. The method according to claim 8, wherein the second etching process further comprises:
etching a second trench into the third dielectric layer; and
etching the via opening underlying the second trench through the third dielectric layer.

12. The method according to claim 11, further comprising:
    lining the via opening with a barrier material; and
    filling the via opening with the second conductive material.

13. The method according to claim 8, wherein the first conductive material is different from the second conductive material.

14. The method according to claim 8, wherein the material of the third dielectric layer is different from the material of the first dielectric layer.

15. A method of connecting a via to a conductive line, the method comprising:
    providing a structure comprising:
        a first dielectric layer;
        a second dielectric layer on top of the first dielectric layer, the second dielectric layer being an organic film having a top surface and comprising a material different from the material of the first dielectric layer; and
        a conductive line formed through the first dielectric layer and the second dielectric layer, wherein a top of the conductive line is coplanar with the top surface of the second dielectric layer;
    depositing a third dielectric layer on the top surface of the second dielectric layer, the third dielectric layer covering the conductive line and contacting the top surface of the second dielectric layer, the material of the third dielectric layer being different from the material of the second dielectric layer;
    forming a via opening through the third dielectric layer, the via opening having a top and a bottom, wherein the bottom of the via opening stops at the top surface of the second dielectric layer, the bottom of the via opening being coplanar with the top surface of the second dielectric layer, a portion of the top of the conductive line being exposed to the via opening;
    performing an additional process to widen the width of the via opening at the bottom of the via opening, wherein a portion of the top surface of the second dielectric layer is exposed adjacent to the exposed portion of the top of the conductive line;
    forming a recess in the exposed portion of the second dielectric layer by removing the exposed portion of the second dielectric layer adjacent to the conductive line, wherein removing the exposed portion of the second dielectric layer exposes a portion of a side of the conductive line; and
    filling the via opening and the recess with a conductive material contacting the conductive line, wherein the conductive material contacts the exposed portion of the top surface of the conductive line and the exposed portion of the side of the conductive line.

16. The method according to claim 15, wherein forming the recess in the second dielectric layer comprises:
    using a wet etching process to remove the exposed portion of the second dielectric layer adjacent to the conductive line.

17. The method according to claim 15, wherein forming the via opening through the third dielectric layer further comprises:
    etching a trench into the third dielectric layer; and
    etching the via opening underlying the trench through the third dielectric layer.

18. The method according to claim 17, further comprising:
    lining the via opening with a barrier material; and
    filling the via opening with a conductive material.

19. The method according to claim 15, wherein the material of the conductive line is different from the conductive material in the via opening.

20. The method according to claim 15, wherein the material of the third dielectric layer is different from the material of the first dielectric layer.

* * * * *